US012626882B2

(12) United States Patent
Vaške et al.

(10) Patent No.: US 12,626,882 B2
(45) Date of Patent: May 12, 2026

(54) SAMPLE CARRIER FOR USE IN A CHARGED PARTICLE MICROSCOPE, AND A METHOD OF USING SUCH A SAMPLE CARRIER IN A CHARGED PARTICLE MICROSCOPE

(71) Applicant: FEI Company, Hillsboro, OR (US)

(72) Inventors: František Vaške, Brno (CZ); Jakub Kuba, Brno (CZ)

(73) Assignee: FEI Company, Hillsboro, OR (US)

( * ) Notice: Subject to any disclaimer, the term of this patent is extended or adjusted under 35 U.S.C. 154(b) by 157 days.

(21) Appl. No.: 17/709,391

(22) Filed: Mar. 30, 2022

(65) Prior Publication Data

US 2022/0319801 A1     Oct. 6, 2022

(30) Foreign Application Priority Data

Mar. 31, 2021     (EP) .................................... 21166433

(51) Int. Cl.
*H01J 37/20*          (2006.01)
*H01J 37/28*          (2006.01)
(52) U.S. Cl.
CPC .............. *H01J 37/20* (2013.01); *H01J 37/28* (2013.01); *H01J 2237/20221* (2013.01); *H01J 2237/2802* (2013.01)
(58) Field of Classification Search
CPC .. H01J 37/00; H01J 37/02; H01J 37/20; H01J 37/26; H01J 37/28; H01J 37/3056; H01J 2237/20221; H01J 2237/2802; H01J 2237/31745; H01J 2237/31749;
(Continued)

(56) References Cited

U.S. PATENT DOCUMENTS

| 4,672,797 A | * | 6/1987 | Hagler | ..................... G01N 1/28 |
| | | | | 53/377.6 |
| 8,729,469 B1 | * | 5/2014 | Schmidt | .............. H01J 37/3023 |
| | | | | 250/311 |

(Continued)

FOREIGN PATENT DOCUMENTS

| EP | 2765591 A1 | 8/2014 |
| JP | 2015013132 A | 1/2015 |

(Continued)

OTHER PUBLICATIONS

Partial European Search Report issued Sep. 24, 2021, for EP Application No. 21166433.9.

(Continued)

*Primary Examiner* — Jason L McCormack

(57)          ABSTRACT

The disclosure relates to a method of preparing a sample in a charged particle microscope. The method comprises the steps of providing a sample carrier having a mechanical support contour and a grid member connected thereto. The method comprises the step of connecting said sample carrier to a mechanical stage device of the charged particle microscope. Additionally, the method comprises the step of providing a sample, for example a chunk-shaped or lamella-shaped sample and connecting said sample to the grid member of the sample carrier. The method allows, in an embodiment, easy and reliable transfer of a sample between a bulk sample and a sample carrier.

11 Claims, 8 Drawing Sheets

(58) Field of Classification Search
CPC .. G01N 1/286; G01N 1/42; G01N 2001/2873;
G01N 23/2202; G01N 23/2204; B01L
9/02
USPC .............. 250/440.11, 453.11, 306, 307, 311,
250/442.11
See application file for complete search history.

(56) References Cited

U.S. PATENT DOCUMENTS

| | | | |
|---|---|---|---|
| 8,754,384 B1* | 6/2014 | Persoon ................. | H01J 37/20 250/306 |
| 2007/0125958 A1 | 6/2007 | Tappel et al. | |
| 2008/0073535 A1 | 3/2008 | Hong et al. | |
| 2008/0173813 A1* | 7/2008 | Van De Water ....... | G01N 23/04 250/311 |
| 2008/0185286 A1 | 8/2008 | Lehmann | |
| 2011/0017922 A1 | 1/2011 | Amador | |
| 2011/0017927 A1* | 1/2011 | Zaykova-Feldman ...................... | H01J 37/3056 250/559.01 |
| 2011/0238225 A1* | 9/2011 | Tripathi ................. | H01J 37/20 250/307 |
| 2013/0037706 A1* | 2/2013 | Ditto ...................... | H01J 37/20 250/307 |
| 2016/0247661 A1* | 8/2016 | Plachinda .............. | H01J 37/20 |
| 2017/0122852 A1 | 5/2017 | Uemoto et al. | |
| 2020/0066482 A1 | 2/2020 | Persoon et al. | |
| 2020/0270070 A1 | 8/2020 | Kratochvíl | |
| 2020/0273659 A1 | 8/2020 | Van Den Boogaard et al. | |
| 2021/0082657 A1* | 3/2021 | Pickreign ............. | H01J 37/265 |

FOREIGN PATENT DOCUMENTS

| | | |
|---|---|---|
| JP | 2020184375 A | 11/2020 |
| WO | WO-2020074026 A1 | 4/2020 |

OTHER PUBLICATIONS

Extended European Search Report issued Jan. 4, 2022, for EP Application No. 21166433.9.

EP22163362.1, Extended European Search Report, Jan. 3, 2023, 15 pages.

EP22163362.1, Partial European Search Report and Provisional Opinion, Aug. 24, 2022, 12 pages.

* cited by examiner

1

SAMPLE CARRIER FOR USE IN A CHARGED PARTICLE MICROSCOPE, AND A METHOD OF USING SUCH A SAMPLE CARRIER IN A CHARGED PARTICLE MICROSCOPE

FIELD OF THE INVENTION

The present embodiments relate to a sample carrier for use in a charged particle microscope, and a method of using such a sample carrier in a charged particle microscope. The present embodiments further relate to devices and methods of sample preparation for imaging systems. More specifically, the present embodiments relate to a sample preparation stage having multiple degrees of freedom allowing for in situ sample preparation and imaging.

BACKGROUND OF THE INVENTION

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example.

Samples for electron microscope imaging require certain preparation for observation under transmitted light or electron radiation. For example, thin slices (or sections) of a sample are typically cut or milled from a bulk sample in a grid or tube. The cutting or milling can be performed by a focused ion beam (FIB) system, or within a dual beam system that includes both a FIB and an electron microscope. Examples of such dual beam systems include the Quanta 3D DualBeam systems from FEI Corporation (Hillsboro, OR, USA). However, after the thin slices are prepared using the FIB, the samples must then be transferred to a platform suitable for imaging. Microscopic imaging, such as scanning transmission electron microscope (STEM), can require positioning along multiple degrees of freedom in order to capture a proper image.

Others have prepared stages for STEM imaging that have multiple degrees of freedom. For example, U.S. Pat. No. 7,474,419 describes a stage assembly for positioning a sample in the vicinity of a reference point. The stage assembly includes a sample table to which the sample can be mounted and a set of actuators arranged so as to effect translation of the sample table along directions substantially parallel to an X-axis perpendicular to a reference plane, a Y-axis parallel to the reference plane, and a Z-axis parallel to the reference plane. The X-axis, Y-axis and Z-axis are mutually orthogonal and passing through the reference point. In addition, U.S. Pat. No. 6,963,068 describes a manipulator that has a table that can be moved in five degrees of freedom, with three perpendicular translations and two rotations.

However, techniques for manipulating samples for STEM or TEM analysis are more complex. These techniques can require manipulating samples for both FIB milling and carving and the later STEM analysis to be performed at specific, critical temperature to prevent ice crystal formation in the sample, or to prevent undesirable thawing of the sample between manipulations. Additionally, it is very difficult to place the lamella in the required orientation in the lamella support. In particular, the thin lamella needs to be (almost) in the same plane as the lamella support, to ensure that the lamella can be positioned correctly in the (S)TEM for further examination. Furthermore, the transfer of the lamella from the sample to said support may involve welding and de-welding operations, which can damage the sample portion, and can even lead to its loss. It is for example possible that the lamella falls off the needle, or off the support.

Thus, what is needed is a system and method that allows for complex manipulations of samples for STEM or TEM imaging without requiring so much sample handling that the sample becomes destroyed.

In US 2008/173813 A1 a manipulator for rotating and translating a sample holder is disclosed. Here, a sample holder having a grid on which a sample is placed is held by a manipulator comprising two members in the form of two tapering cylinders.

US 2020/273659 A1 describes a sample holder for a charged particle microscope, comprising a holder body with a recess for releasably receiving a sample carrier with a sample therein.

SUMMARY

According to an aspect, a method of preparing a sample in a charged particle microscope is provided, as defined in claim 1. The method comprises the steps of providing a sample carrier having a mechanical support contour and a grid member connected thereto, and connecting said sample carrier to a mechanical stage device of said charged particle microscope. As defined herein, the method further comprises the steps of providing a sample, such as a lamella-shaped or chunk-shaped sample, and connecting said sample to the grid member of the sample carrier. The step of connecting said sample to the grid member of the sample carrier is performed in a condition wherein the mechanical support contour and the grid member are already connected to each other. In other words, the step of connecting said sample to the grid member of the sample carrier is performed after the step of providing the sample carrier having the mechanical support contour and the grid member connected thereto.

In contrast to prior art methods, the sample is connected to the grid member in a pre-connected state of the grid member and the mechanical support contour. Instead of an indirect transfer of placing the lamella or chunk on the grid member, and then connecting the grid member with lamella to the mechanical support, a direct transfer is possible. This saves time, and reduces the risk of damaging the lamella or chunk, e.g. during placement of the grid member in the mechanical support. This is in contrast to prior art methods, where the sample is connected to the grid member first, and then the combination of the grid member and the sample are connected to the mechanical support contour.

The method may comprise the step of connecting said sample to the grid member of the sample carrier in a condition wherein the sample carrier is connected to said mechanical stage device.

As indicated before, said grid member may comprise a halfmoon grid and/or said mechanical support contour may be ring-shaped, annular, or have a substantially closed contour, as described above.

As indicated before, the grid member may be integrally connected to said mechanical support contour.

3

The method may in an embodiment be performed on a charged particle microscope that comprises a focused ion beam microscope.

The step of providing said sample comprises, in an embodiment, the steps of providing a bulk sample and using said focused ion beam for creating said sample, such as a lamella-shaped sample or chunk-shaped sample, in said bulk sample.

The method may comprise the step of releasing said sample from said bulk sample and transferring said sample to said sample carrier.

An elongate transport member may be used for transferring said sample.

In an embodiment, said elongate transport member defines an angle with a plane defined by said sample carrier, and said angle is kept substantially constant during at least a substantial part of transfer of said sample to said sample carrier. The angle is in particular kept constant whilst moving from said bulk sample to said sample carrier. It is noted that releasing said sample from said bulk sample and/or attaching said sample to said sample carrier may include changes in said angle. A substantial part is viewed as at least 80%, preferably at least 90%, or more preferably at least 95% of the distance to be travelled between the bulk sample holder and the grid sample holder.

In an embodiment, translational movement is substantially used for transferring said sample.

Said translational movement may be provided by means of relative movement between the elongated manipulator and a mechanical stage of said charged particle microscope. In particular, the elongated manipulator may be moved with respect to said mechanical stage. It is conceivable that some mechanical stage movements may be performed as well during the transfer.

In an embodiment, said elongate transport member comprises a needle. A needle provides easy and quick transport. It is conceivable that other shapes are usable as well.

The method as defined herein may be performed under cryogenic conditions.

The method may be performed on a multi-axis sample preparation stage, that includes a bulk sample holder configured to rotate a sample position about a first bulk axis parallel to the direction of the bulk sample holder and also rotate the sample position about a bulk flip axis that is perpendicular to the direction of the bulk sample holder; and a grid sample holder for holding a sample grid adjacent the bulk sample holder and configured to rotate the sample grid about a first grid axis parallel to the direction of the grid sample holder and a grid flip axis that is perpendicular to the direction of the grid sample holder.

The method may also be performed on a sample preparation stage, comprising a bulk sample holder and a grid sample holder, wherein the sample preparation stage is rotatable about a bulk flip axis that is perpendicular to the direction of the bulk sample holder. It is conceivable that both the bulk sample holder and the grid sample holder are fixedly provided with respect to each other, meaning that the rotation of the preparation stage leads to similar movement of both the bulk sample holder and the grid sample holder. The rotation axis (bulk flip axis) may lie in the XZ-plane, and the elongated manipulator may substantially extend in said XZ-plane as well. It is noted that the bulk sample holder and the grid sample holder may be angled with respect to a base plate of the preparation stage, i.e. may be placed under an angle with respect to the XY-plane. This angle may be, for example, about 45 degrees.

The method may also be performed in a dual beam system having a focused ion beam and a scanning electron microscope. This system may include the multi-axis sample preparation stage as described above.

The method as defined herein may be performed in situ, by preparing a sample by providing the multi-axis sample preparation stage as described above, and then cutting a lamella or chunk from a bulk sample stored in the bulk sample holder; and transferring the lamella from the bulk sample holder to the grid member of the sample carrier that is provided on the grid sample holder.

According to an aspect, the invention provides a sample carrier for use in the method as defined herein. The sample carrier comprises a mechanical support contour that is arranged to be connectable to a mechanical stage device of the charged particle microscope. The sample carrier additionally comprises a grid member that is connected to said mechanical support contour and arranged for holding a sample, in particular a sample that emanates from a bulk sample. Said sample may be, for example, a so-called chunk or lamella, even though other shapes and forms are conceivable as well. More generally, the embodiments include any relatively smaller piece of sample that is collected from a relatively larger bulk sample. As defined herein, said grid member is arranged for receiving said sample in an assembled state of said sample carrier.

Said grid member may, for example, be a so-called halfmoon grid, also referred to as half-grid lift-out TEM sample holders for FIB applications (FIB lift-out grid), such as also described, for example, in U.S. Pat. No. 9,159,531 B2.

Said mechanical support contour may, for example, be ring-shaped, annular, or have a substantially closed contour. The mechanical support may, for example, be a so-called Cryo-FIB AutoGrid, available from Thermo Fisher Scientific, FEI Company, Hillsboro, Oregon, US.

As defined herein, said grid member is pre-connected to said mechanical support contour, wherein said grid member is free from any sample in said pre-connected state. One of the advantages of the sample carrier according to the invention is that it allows lamella or chunks to be placed on said grid member (also referred to as a lamella support) whilst this grid member is already placed inside said mechanical support, or at least pre-connected thereto. Instead of an indirect transfer of placing the lamella or chunk on the grid member, and then connecting the grid member with lamella to the mechanical support, a direct transfer is possible. This saves time, and reduces the risk of damaging the lamella or chunk, e.g. during placement of the grid member in the mechanical support.

As stated before, the invention is beneficial for transferring lamellas or chunks that emanate from a larger bulk sample. The invention is not, however, limited to any specific geometry or shape of the lamella or chunk being transferred to the pre-connected sample carrier.

The sample carrier may comprise said lamella-shaped or chunk-shaped sample. Said lamella-shaped sample or chunk-shaped sample may be connected to said sample carrier only when said sample carrier, including said grid member being pre-connected to said mechanical support contour, is attached to said mechanical stage device of said charged particle microscope.

In an embodiment, said grid member and said mechanical support contour are integrally formed. This means that the grid member and the mechanical support can be integrally connected, i.e. fixedly connected to each other. For example, the grid member and the mechanical support can be fixedly connected to each other during the manufacturing process, which can include a moulding technique or a MEMS-manufacturing based technique, for example. This way the grid member and mechanical support contour are already fixedly connected to each other, and no pre-clipping step needs to take place. The integrally formed sample carrier can advantageously be used in the method as disclosed herein, which will be described next.

DETAILED DESCRIPTION

Figure 1:
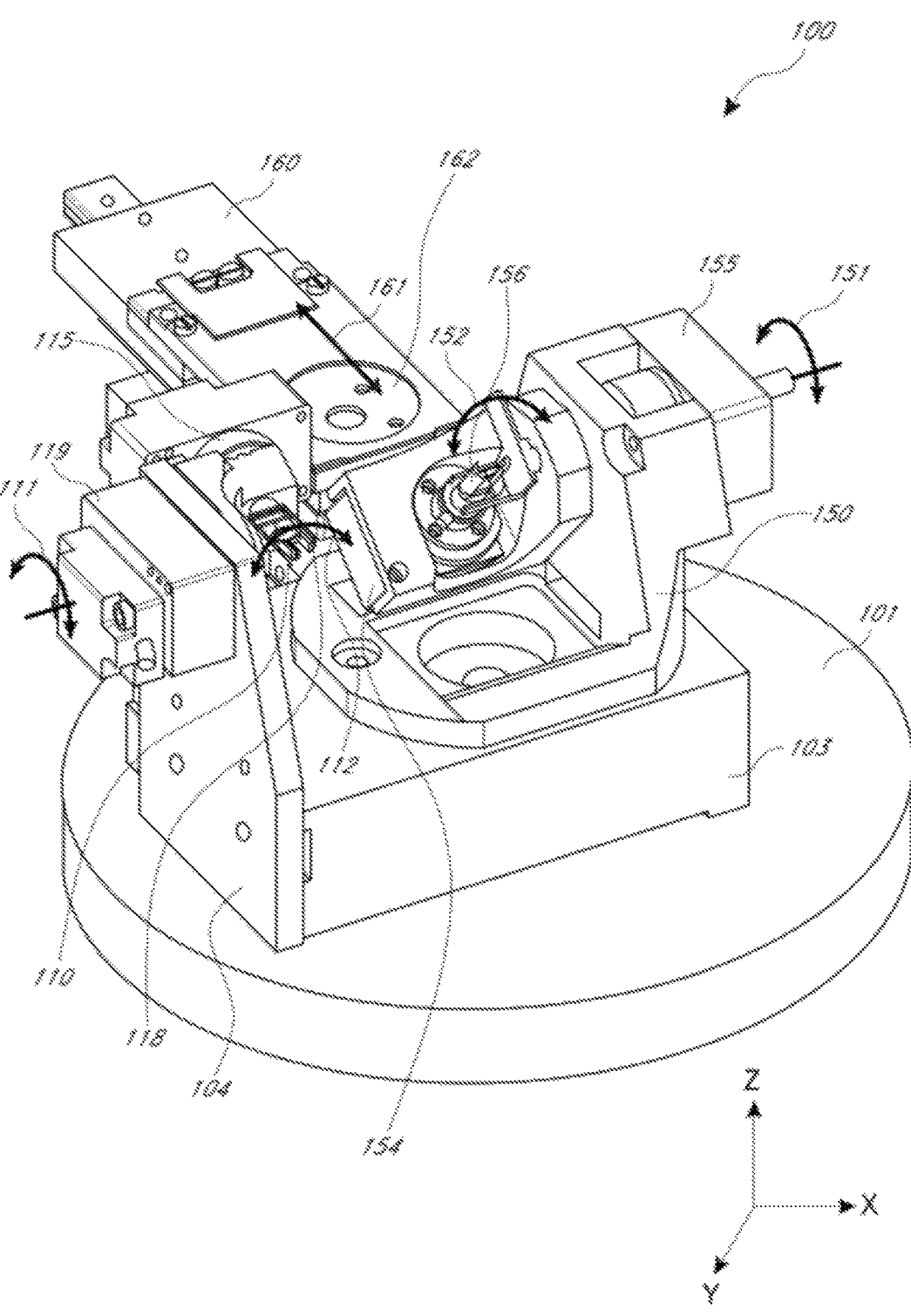
FIG. 1 is a perspective view of one embodiment of a base stage having a bulk stage and a grid stage.

Embodiments of the invention relate to sample carriers, sample processing systems and methods for preparing a sample for imaging in a charged particle microscope, such as an electron microscope. The sample carrier may be used in a sample preparation and imaging stage for a dual beam electron microscope that has multiple sample locations and the ability to tilt each sample location about several axes. One embodiment of the multi-axis stage has a bulk preparation stage for manipulating a bulk sample, for example by performing a focused ion beam treatment of the bulk sample to mill or slice off a lamella-shaped sample of the bulk sample for further imaging. The multi-axis stage can include a holder for a grid, tube, planchet or TEM liftout grid in order to handle a variety of sample types. In particular, the holder may be part of a mechanical stage device of the charged particle microscope that is arranged to connect to a sample carrier as defined herein. In addition, the multi-axis stage may be configured to move in multiple directions with multiple degrees of freedom so that the bulk sample can be positioned under a FIB to properly mill or slice the bulk sample.

In addition to the bulk preparation stage, embodiments of the multi-axis stage also include a grid stage which is configured to hold a thin structure (e.g., lamella) of the bulk sample mounted onto a grid for imaging. Thus, once cut, a lamella from the bulk sample can be transferred from the bulk stage to the grid stage by using an elongate transport member, for example in the form of a manipulator needle. In some embodiments, because the grid stage can move in multiple dimensions, it is possible to perform dual axis tomography where more than one angle can be viewed. Because the bulk stage and grid stage are on the same multi-axis stage, a single multi-axis stage can be used to cut a lamella and also then perform TEM scanning on the cut lamella section without venting a chamber used to transfer the lamella to the grid stage. The multi-axis stage can thus include a bulk stage with multiple degrees of freedom and a grid stage with multiple degrees of freedom along various axes which allows the components of the system to move in multiple dimensions with respect to one another.

The multi-axis stage can be positioned in such a way that embodiments of the method as defined herein can be performed. This includes the step of providing a sample carrier as defined herein, wherein said sample carrier has a mechanical support contour and a grid member connected thereto, and connecting said sample carrier to the mechanical stage device of said charged particle microscope, in particular by connecting said sample carrier to the grid stage of the multi-axis stage. This also includes providing a sample, such as a lamella-shaped sample or chunk-shaped sample that is taken from a bulk sample that is provided in the bulk stage, and connecting said sample to the grid member of the sample carrier. The multi-axis stage also allows the step of releasing said lamella shaped sample or chunk-shaped sample from said bulk sample and transferring said lamella shaped sample to said sample carrier, in particular when an elongate transport member, such as a manipulator needle, is used for transferring said lamella shaped sample. The multi-axis stage further allows easy transport of the lamella shaped sample to the sample carrier, as said elongate transport member defines an angle with a plane defined by said sample carrier, and said angle is kept substantially constant, by means of a translational movement, for example, during transfer of said lamella-shaped sample to said sample carrier. Thus, the mechanical stage, in particular the multi-axis stage, of said charged particle microscope allows for providing translational movement.

It should be realized that many different types of treatments can be applied to a sample, as discussed below. Embodiments of the invention include any type of treatment that may be used for preparing a sample for transmission electron microscope (TEM) or scanning transmission electron microscope (STEM) analysis. For example, a lamella or chunk may be prepared from a site located in a bulk sample. In this system, the bulk stage would hold a bulk sample in which a lamella site or chunk site would be located. The lamella or chunk would then be prepared on the bulk stage.

In addition, it should be realized that the present embodiments are not limited to any particular configuration of microscope. For example, any type of microscope that is used to capture images of a sample is within the scope of the present embodiments. Such microscopes include, for example, visible light microscopes, confocal microscopes, and infrared and near infrared microscopes. Those skilled in the art will recognize that embodiments exemplified herein with regard to an electron microscope can be readily adapted to other types of microscopes.

In another embodiment, a lift out procedure may be performed. In this system, a manipulator may transfer a lamella or chunk located on the bulk stage to the grid of the sample carrier that is provided on a grid stage. In some embodiments, the lamella may be further processed after the manipulator is removed. For example, the lamella may be milled from a thick lamella to a thin lamella using a focused ion beam.

Lamella preparation can include processes such as locating a lamella site (including multiple cross sections of the sample), protective deposition (e.g., coating the lamella site with a metal cap layer), adding fiducial markers, rough milling (e.g., to create lamella about 2 μm), medium milling (e.g., to thin lamella to about 250-400 nm), fine milling (e.g., to thin the lamella to a final thickness), undercutting to release sample from the substrate, endpointing, cleaning lamella (e.g., low kV cleaning), and/or transferring the sample.

The system and methods disclosed herein can be used for sample preparation of cryogenically frozen samples. For example, the methods can be performed without venting the microscope chamber. FIB preparation can be used with cryogenically frozen samples in a suitably equipped instrument such as a dual beam microscope, allowing cross sectional analysis of samples containing liquids or fats, such as biological samples, pharmaceuticals, foams, inks, and food products. As discussed in more detail below, the system can further include temperature control elements for maintaining a temperature in the system. Accordingly, in some embodiments, the methods disclosed herein can be performed at room temperature, elevated temperatures, and/or at cryogenic temperatures.

As used herein, the term "sample" can include any type of sample from a biological organism, but typically includes tissue, cells, viruses, cell structures, or any other biological sample of interest.

The sample can be prepared for electron microscopy to be used in material science applications, such as for semiconductor materials or polymers. Electron microscopy may also be used in the biological and life sciences fields for applications such as diagnostic electron microscopy, cryobiology, protein localization, electron tomography, cellular tomography, cryo-electron microscopy, toxicology, biological production and viral load monitoring, particle analysis, pharmaceutical quality control, structural biology, 3D tissue imaging, virology, and vitrification. These separate types of applications can be performed by a range of different types of electron microscopes including, for example, transmission electron microscopes (TEM), scanning electron microscopes (SEM), reflection electron microscopes, scanning transmission electron microscopes, and low-voltage electron microscopes.

Overview of Sample Preparation System

FIG. 1 is a perspective view of one embodiment of a multi-axis stage 100. The multi-axis stage 100 includes a circular base 101 that is supporting a rectangular stand 103. Mounted on a left edge of the rectangular stand 103 is vertical wall 104 that holds a bulk stage 110. The bulk stage 110 is movably mounted to the vertical wall 104 and used to hold a bulk sample.

The bulk stage 110 includes a bulk rotation actuator 115 configured to rotate a sample holder 118 circumferentially about a bulk rotation axis 112 as illustrated. Thus, movement of the actuator 115 results in rotational movement of the bulk sample in the sample holder 118 with 360 degrees of movement around the Y axis of the multi-axis stage 100. This allows the sample to be rotated along an axis that is parallel to the direction of the sample holder 118.

In addition to this rotational movement, the bulk stage 110 also has multiple degrees of freedom about a bulk flip axis 111 which uses a flip actuator 119 mounted to the vertical wall 104 to rotate the sample holder 118 around the X axis to "flip" the sample from the front of the base stage 100 to the rear of the multi-axis stage 100 and back. This allows the bulk sample holder 118 to rotate around a line that is perpendicular to the direction of the sample holder.

Rotation of a bulk sample about the bulk rotation axis 112 allows a sample treatment, such as a focused ion beam treatment, to result in a rotationally symmetric sample about the rotation axis. This can remove, or reduce, non-isotropy/inhomogeneity in the sample after ion beam treatment. Together with this angular degree of freedom (DOF) about the rotation axis, the further angular DOF provided about the bulk flip axis 111 allows a wide range of specific crystallographic orientations in the sample to be oriented along the first and/or second irradiating beam. Thus, the combined angular DOFs about the rotation axis and the flip axis allow both α-tilt and β-tilt of the sample.

In a particular embodiment, the angular stroke of the sample holder 118 about the bulk flip axis is substantially 360 degrees or more. If the flip axis is arranged to be parallel to a principal axis (by suitable angular adjustment of the stage assembly about the rotation axis) of the multi-axis stage 100, and the focused beam is an ion beam, such an angular stroke allows the stage assembly to be used as a type of "ion lathe". In such a set-up, one could manufacture various precision items, such as tips and probes that are required to have a particular cylindrical/conical profile about the flip axis. In a similar fashion, one could realize a "laser lathe", using a laser beam as the second irradiating beam.

Mounted to the rectangular stand 103 and directly adjacent the bulk stage 110 is a grid stage 150. Similar to the bulk stage, the grid stage 150 is mounted to the rectangular stand 103 so that it also provides a sample with multiple degrees of freedom about several axes. As indicated in FIG. 1, the grid stage 150 has a grid flip axis 151 and a grid rotation axis 152 that allow movement of a grid holder 156 in multiple X and Y dimensions. Rotational movement along the grid rotation axis 152 is controlled by a grid rotation actuator 154 and moves the grid holder 156 around the Y axis of the multi-axis stage 100. The allows the grid holder to rotate in a direction that is parallel to the grid holder 156.

Rotational movement along the grid flip axis 151 is controlled by a flip actuator 155 which allows the grid holder to rotate about the X axis of the multi-axis stage 100. This allows the grid stage to rotate in a direction around the Y axis of the multi-axis stage 100. This multi-axis rotational movement provides several degrees of freedom for samples placed into the grid holder 156 to provide imaging of the sample.

As can be realized, by having the bulk stage and the grid stage located adjacent one another and mounted to the same base, one can use this single stage for preparing samples using an ion beam, and then imaging those samples with an electron beam. In particular, the single stage allows a lamella-shaped sample to be In a dual beam device, the multi-axis stage can be placed within the device and then used to prepare and image samples without the requirement of removing the multi-axis stage from the dual beam device. Moreover, as discussed below, samples can be kept at a desired temperature by cooling or heating the multi-axis stage to a desired temperature and then performing all of the sample manipulations within a dual beam system without needing to expose the stage and samples to room temperature conditions.

At the rear portion of the multi-axis stage 100 is a STEM stage 160 that allows transverse movement 161 of a detector holder 162 for performing a scanning transmission electron microscopy on a sample using the same multi-axis stage 100. In some embodiments, the aforementioned components can move about the axes independent of one another.

At the rear portion of the multi-axis stage 100 a retractable S/TEM detector can be placed at in the detector holder 162 that can be retracted by retractor 160. The detector can also be protected by a cover to avoid, for example, radiation damage or chemical damage. In some embodiments the cover may be used in place of the retractability of the S/TEM detector.

Figure 2:
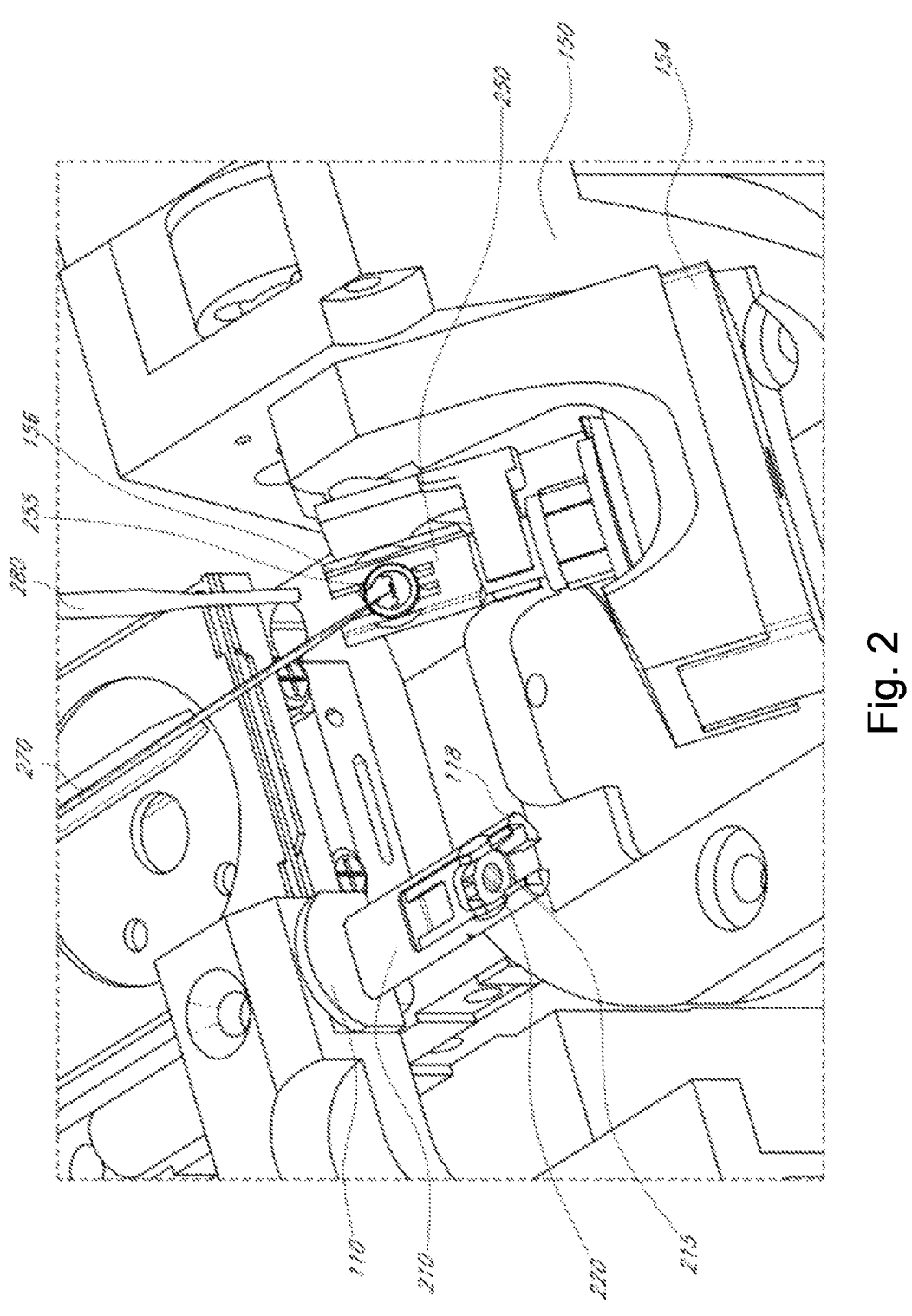
FIG. 2 is an enlarged view of the bulk stage and the grid stage of FIG. 1.

FIG. 2 is an enlarged view of one embodiment of the bulk stage 110 and the grid stage 150 showing their relationship to one another. The bulk stage includes a bulk arm 210 configured to hold a bulk sample carrier 215 with a bulk sample 220. The bulk arm 210 can rotate about the bulk stage such that the orientation of the bulk sample 220 changes. For example, the bulk arm 210 can rotate about the bulk rotation axis 112 to rotate the bulk sample 220. The bulk arm 210 can also flip about the bulk flip axis 111 to flip the bulk sample 220.

Adjacent the bulk stage 110 is the grid stage 150 which is shown with a grid arm 250 configured to hold a sample carrier 255 that is configured to hold a sample. The grid arm 250 can move about the grid stage with multiple degrees of freedom such that the orientation of the sample carrier 255 changes over time and during electron microscopy. For example, the grid arm 250 can rotate about the grid rotation axis 152. The grid arm 250 can also flip about the grid flip axis 152 to flip the grid plate.

Figure 3:
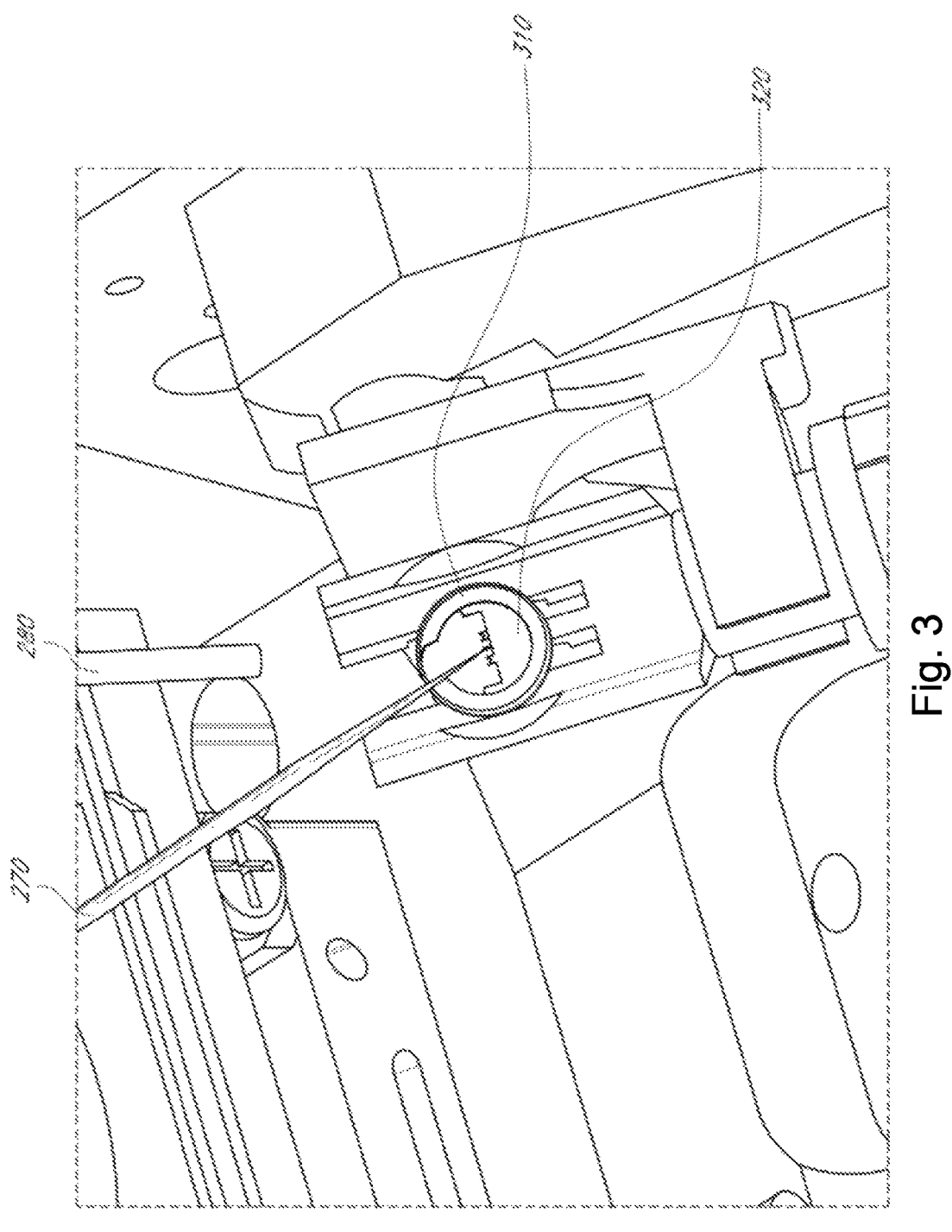
FIG. 3 is an enlarged view of the prepared sample of FIG. 2.

As shown in FIG. 2, a manipulator 270 and a gas supply system 280 can be used to transfer a lamella taken from the sample 220 at the bulk stage 110 and move the lamella to the grid stage 150 by methods known in the art. As shown in FIG. 3, the lamella 410 can be mounted to the sample carrier 255 comprising a mechanical support contour 310 and a grid member 320, for further analysis.

As proposed herein, the lamella sample transfer to said sample carrier 255 may take place by providing the sample carrier 255 having said mechanical support contour 310 and said grid member 320 connected thereto, and placing said sample carrier 255 in said grid stage. The method as proposed herein further comprises, in an embodiment, the step of providing a bulk sample and creating a lamella-shaped sample in said bulk sample, for example by means of said FIB.

Figure 4:
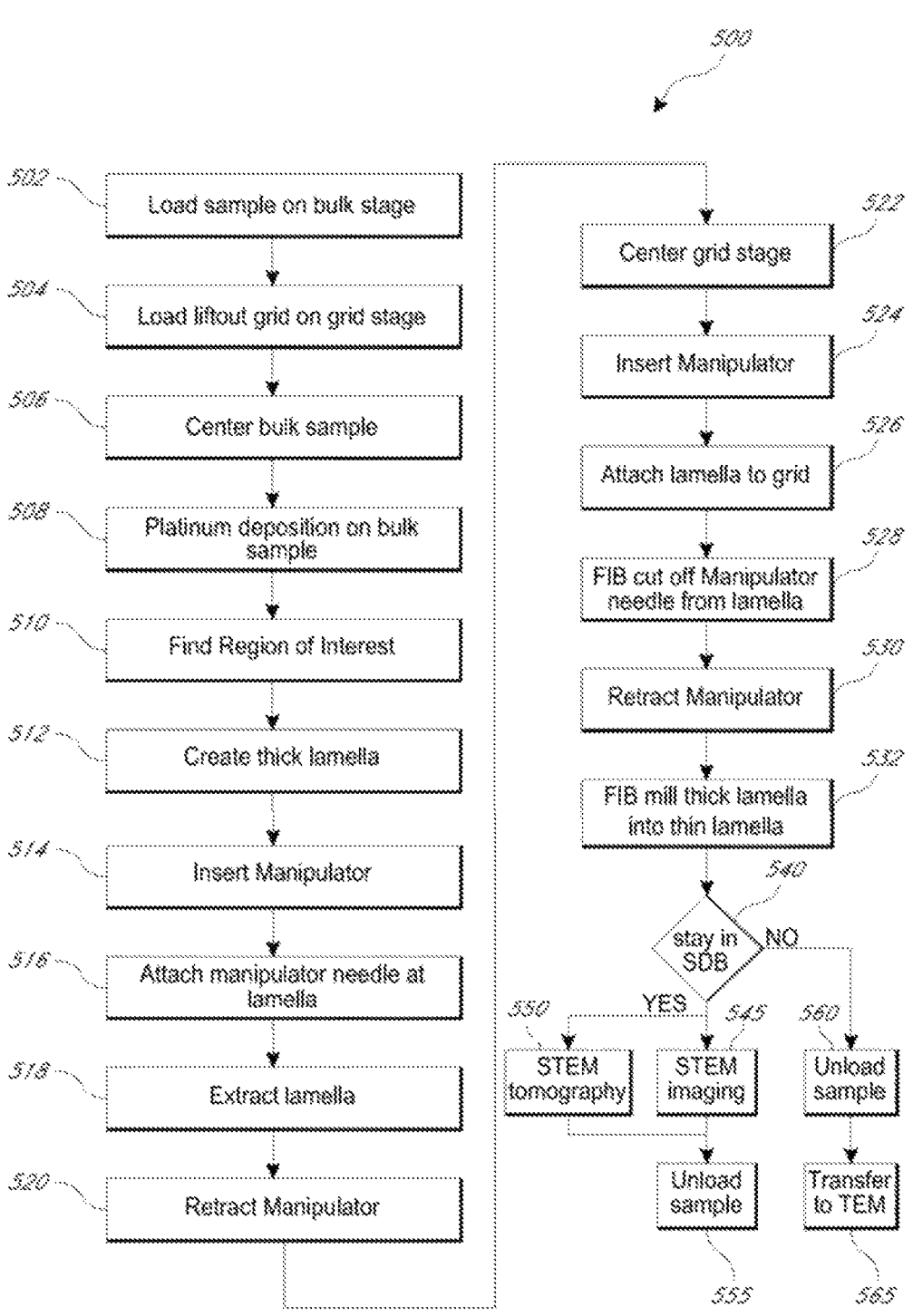
FIG. 4 is a flow diagram of one embodiment of a method for in situ preparation of a sample for imaging.

Then, as shown in FIG. 4, the bulk stage may be positioned in such a way that the bulk sample is placed parallel to the XY plane of the stage (see FIG. 1 for XYZ-coordinates). The sample carrier may be placed in such a way that the grid member, which is substantially planar, is positioned substantially parallel to the XY plane of the stage. The stage may then be tilted about the x-axis, for example about 10 degrees, and rotated about the z-axis, for example about 10 degrees, so that it enables the lamella-shaped sample to be transferred by the elongate transfer member, such as for example a transfer needle, from said bulk sample to said sample carrier by means of a translational movement of the stage (i.e. movement in the XY plane), without the mechanical support contour blocking the elongate transfer member. The method as described here allows the elongate transport member to define an angle with a plane defined by said sample carrier, and to keep said angle substantially constant during transfer of said lamella-shaped sample to said sample carrier. A pure translational movement, for example provided by the multi-axis stage, can then be used for transferring said lamella-shaped sample.

Figure 8:
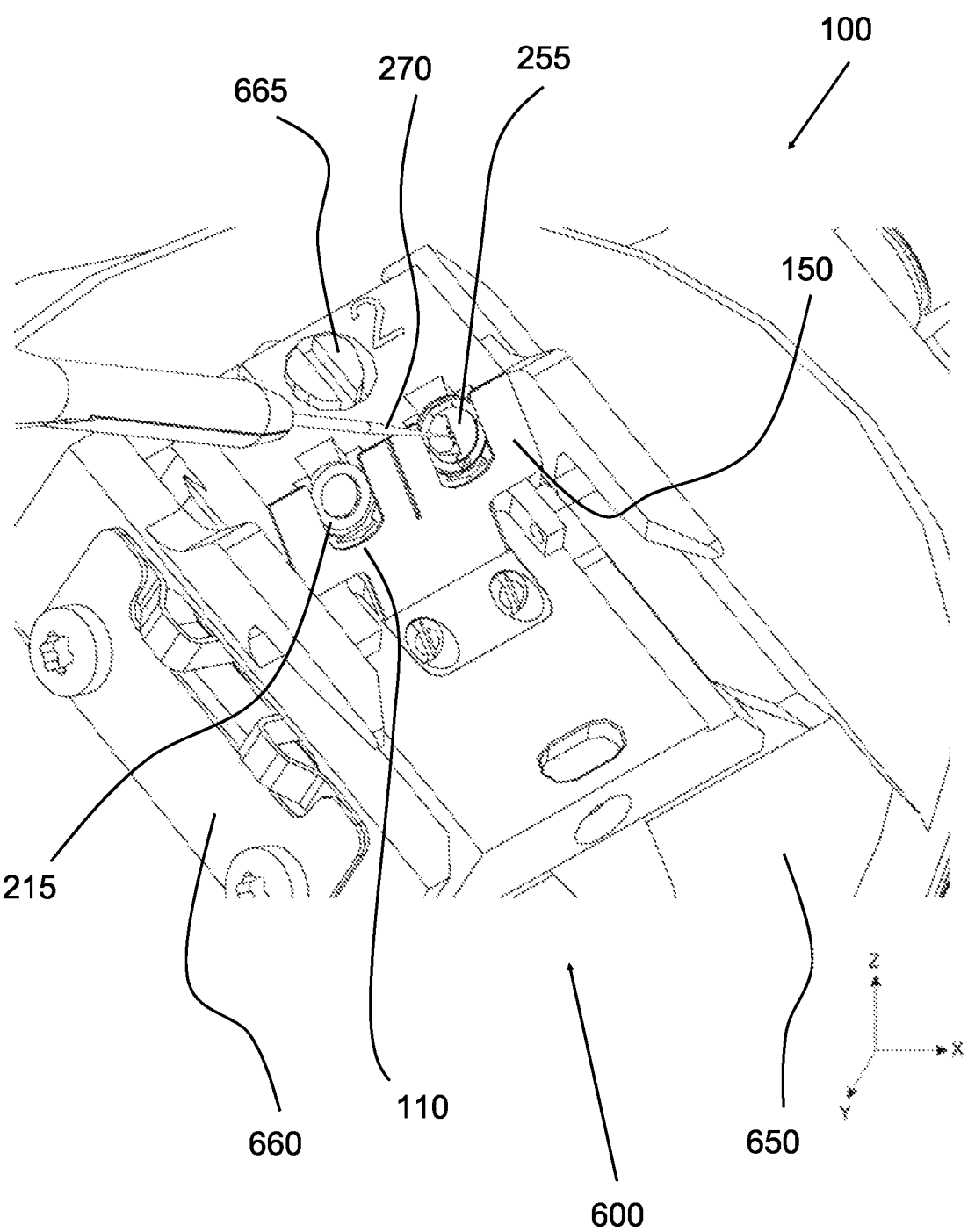
FIG. 8 shows an embodiment of a multi-axis stage.

In another embodiment, shown in FIG. 8, the stage 600 merely comprises a rotational axis that lies in the ZX plane, which allows the elongated manipulator 270 to be placed under an angle with respect to a plane defined by said bulk sample carrier 110 and/or said sample carrier 150. This allows the elongated manipulator 270 to pick-up the lamella or chunk from the bulk sample and move it towards the sample carrier 150 in such a way that the elongated manipulator evades contact with the mechanical support contour of the sample carrier. In the embodiment shown in FIG. 8, the bulk sample holder 110 and the grid holder 150 are fixedly connected with respect to each other, meaning that relative movement between the two is prevented. The grid holder 150 and the bulk sample holder 110 are provided at a 45-degree angle with respect to the XY-plane. The bulk sample holder 110 and the grid holder 150 substantially lie within the same plane. The embodiment of FIG. 8 is a simple yet effective construction for bulk sample preparation and subsequent transfer from bulk sample to a sample carrier as defined herein.

Of course, it should be realized that the present embodiments are not limited to any particular configuration of bulk sample carrier 215, as long as it comprises a grid member and a mechanical support contour. The mechanical support contour substantially encloses the grid member, in particular about a circumference of said substantially planar grid member, so that the mechanical support contour at least partially blocks a line of sight to said grid member. In principle, any type of sample carrier that is used to hold a sample and allow for preparation as disclosed herein, is within the scope of the present embodiments. Similarly, it should be realized that the present embodiments are not limited to any particular configuration of the grid plate 310. For example, any type of plate that used to hold a sample and allow for further processing and/or imaging as disclosed herein, is within the scope of the present embodiments. Embodiments include the aforementioned half-moon plate, but other plates are conceivable as well.

Exemplary Methods for Sample Preparation

FIG. 4 shows a flowchart illustrating an exemplary process 500 that may run within one implementation of a sample preparation system 100. Process 500 begins at block 502, where the bulk sample is loaded on the bulk stage. After the bulk sample has been loaded onto the bulk stage, the process moves to block 504, wherein a liftout grid is loaded on the grid stage. Process 500 then moves to block 506, where the bulk sample is centered on the bulk stage. For example, the bulk sample can be positioned by rotating the bulk sample arm about the bulk rotation axis and/or flipping the bulk sample arm about the bulk flip axis to properly position the bulk sample for creating a desired lamella.

Once the bulk sample has been positioned, the process 500 moves to block 508, where a protective metal layer is locally deposited on the bulk sample. It should be realized that in other embodiments, the order to blocks 508 and 510 can be reversed. As discussed herein, the protective metal layer can include any material, such as, for example, platinum or tungsten, although other materials are conceivable as well. It is noted that sputter coating may be used before block 508, which is known per se to those skilled in the art. Process 500 then moves to block 510, where a region of interest on the bulk sample is determined by the user. The region of interest can include, for example, one or more isolated features and/or one or more reference features, such as a fiducial marker in the deposited protective metal layer. Alternatively, the region of interest can be marked by having previously placed the sample in an optical microscope and using a laser marker to indicate the region of interest.

Once a region of interest has been located, process 500 moves to block 512, where a lamella is cut. As discussed herein, the lamella may be positioned to optimize the feature of interest location. In some embodiments, a thick lamella is cut. In one embodiment, the lamella is cut using a focusing ion beam that is targeted to cut a desired lamella from the bulk sample. As can be appreciated, the desired region is properly cut by using the multiple degrees of freedom provided by the bulk stage, as described above. Once the lamella has been cut, the lamella is transferred from the bulk stage to the grid stage by an operator.

Figure 5:
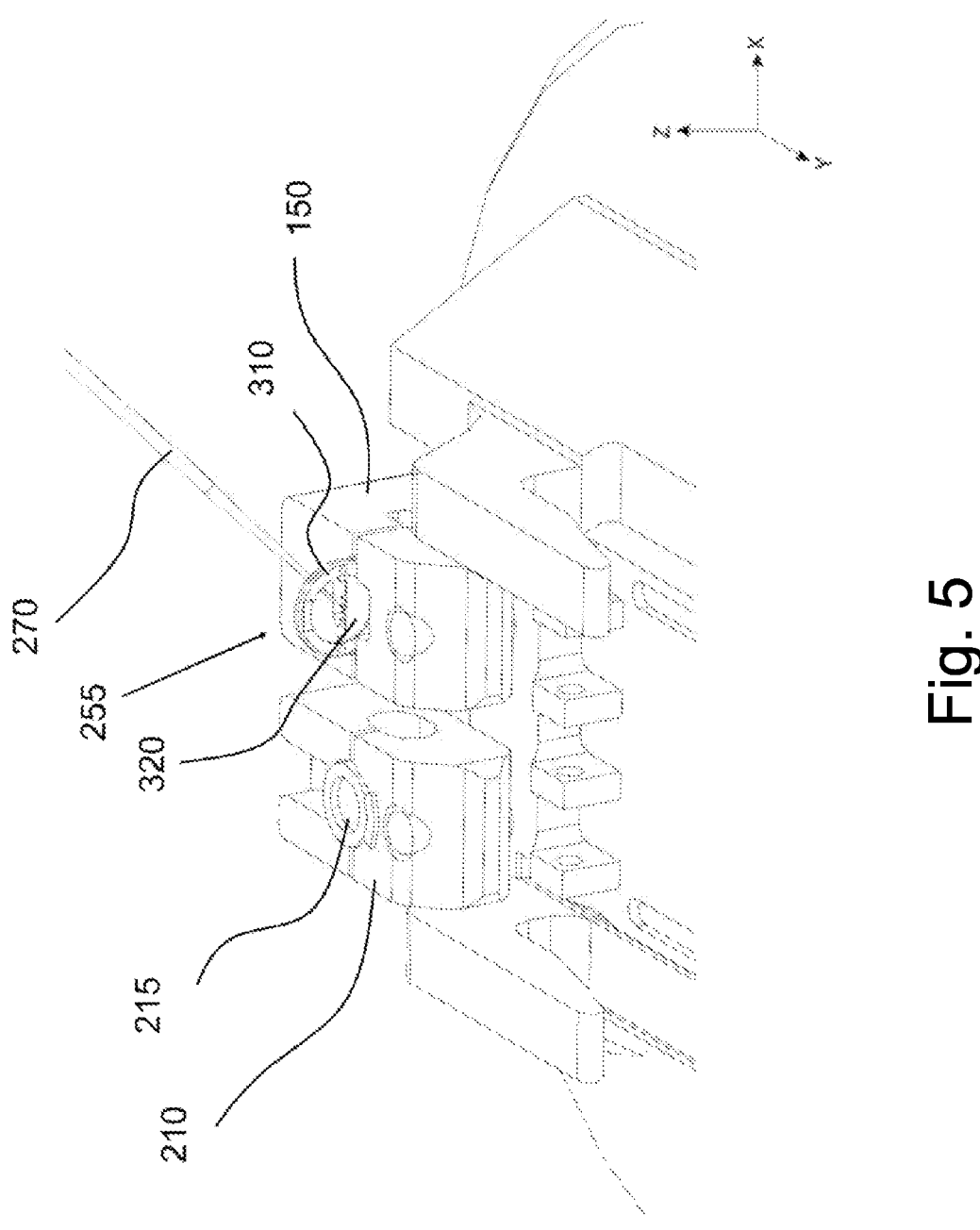
FIG. 5 is an enlarged view of the setup for preparing a sample as disclosed herein.

To this end, the set-up of FIG. 5 may be used. Here, it can be seen that the bulk sample 215 is provided on the bulk stage 210, and that the sample carrier 255 is connected to the sample stage 150. An elongated manipulator 270 in the form of a needle is shown, and can be used for transferring the lamella-shaped sample from the bulk sample to the sample carrier. As shown in FIG. 5, the sample carrier 255 has a mechanical support contour 310, with which the sample carrier 255 is connected to the grid stage 150. The sample carrier 255 also has a grid member 320, such as a half-moon grid, that is connected to said mechanical support contour 310 and arranged for receiving said lamella-shaped sample. In the embodiment shown in FIG. 5, the sample carrier 255 is connected to the grid stage 150 in such a way that a plane defined by the sample carrier 255 is positioned substantially perpendicular to a plane defined by the bulk sample 215 that is connected to the bulk stage 210. In other words, if the bulk sample 215 is mainly located in the XY-plane, then the sample carrier 255 is mainly located perpendicular to said XY-plane, e.g. parallel to the ZX-plane, for example. As shown in FIG. 5, the elongated manipulator is positioned at an angle with respect to a plane defined by said sample carrier, so that it can approach the grid member 330 without colliding with the mechanical support contour 310 of the sample carrier 255. This setup allows a quick and easy transfer of the lamella-shaped sample from the bulk sample to the sample carrier, wherein pure translational movement of the multi-axis stage 100 with respect to the manipulator needle can be used to effect the transfer. This will be explained in more detail by returning to block 514 of FIG. 4.

As one example, at block 514 the elongated manipulator is inserted into the bulk sample and at block 516 the manipulator is then attached to the lamella that has been cut from the bulk sample. The manipulator can be, for example, a needle or other device configured to attach to a lamella. For example, the manipulator may be temporarily attached to the lamella to enable transport between the bulk stage and the adjacent grid stage. The manipulator then extracts the lamella at block 518. And the manipulator is retracted from the bulk sample at block 520.

Process 500 then moves to block 522, where the grid stage with the sample carrier may be centered by means of a translational movement of the multi-axis stage. The manipulator is now close to the sample carrier, and then the lamella can be attached to the grid member of the sample carrier. The process 500 now moves to block 528, wherein the manipulator is detached from the lamella. For example, a FIB can be used to cut the manipulator needle from the lamella. The manipulator can then be retracted at block 530.

As discussed herein, in some embodiments, the lamella can be thinned from a thick lamella to a thin lamella. For example, the process 500 moves to block 532, where the thick lamella is thinned to a thin lamella by a focused ion beam.

After the lamella has been transferred to the sample carrier on the grid stage and thinned to the desired thickness, process 500 moves to decision block 540 to determine if the lamella will be examined in a small dual beam device (SDB). If a decision is made to not stay within the SDB device, then multi-axis stage 100 can be unloaded at block 560 and transferred to, for example, a TEM system at block 565. However, if a decision is made to remain with the SDB device, the sample can be directly STEM imaged. For example, the sample can undergo STEM tomography at block 550 before being unloaded at block 555. In another example, the sample can undergo STEM imaging at block 545 before being unloaded at block 555.

It is noted that embodiments of the invention also cover variants of the method, in which, for example, step 502 and 504 are exchanged, or blocks 510 and 508, etc., as is clear to the person skilled in the art.

Temperature Control of Multi-Axis Stage

Figure 6:
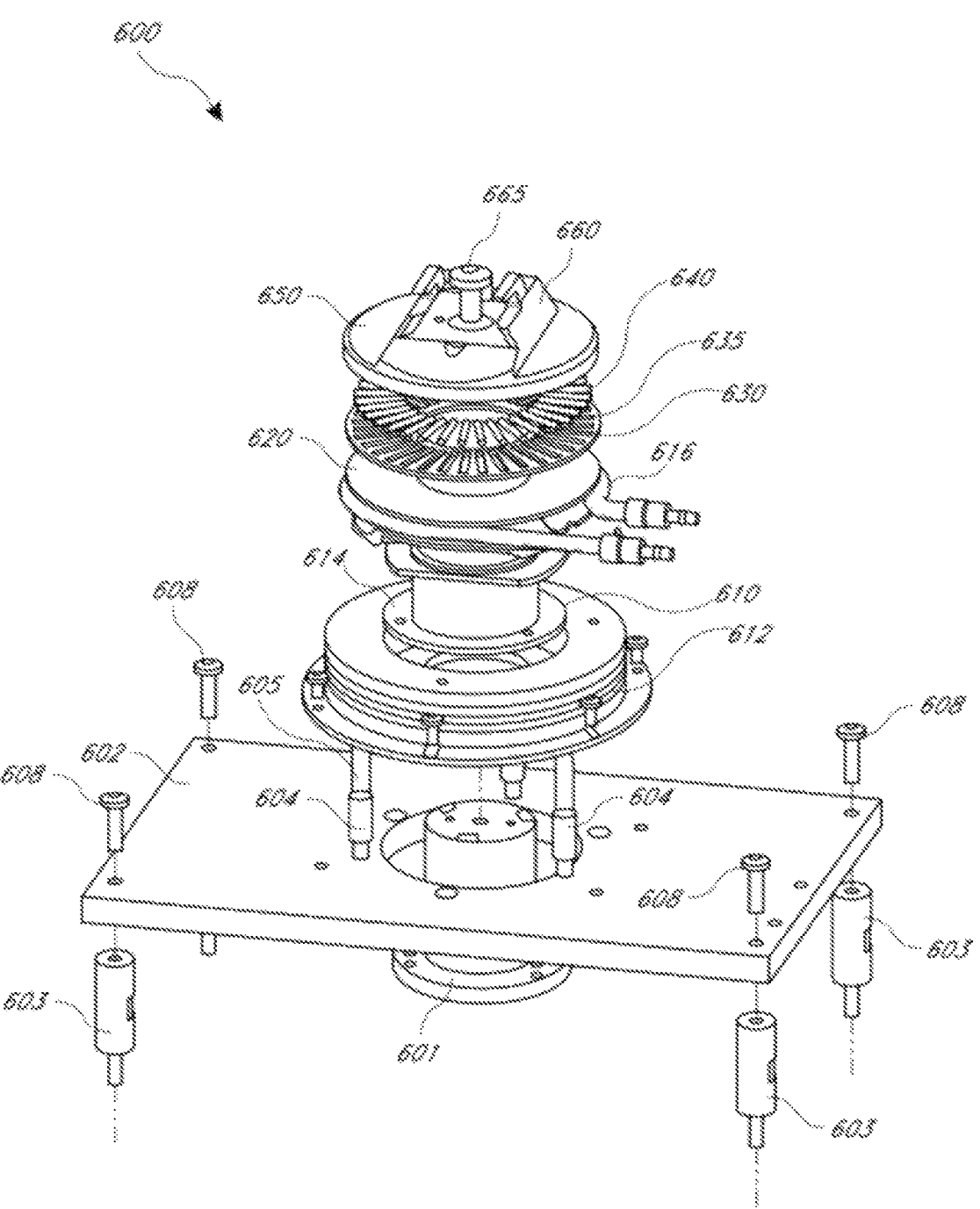
FIG. 6 is a perspective view of one embodiment of a heating/cooling element via bearings.

In some embodiments, the system can further include a thermal control system configured to control the temperature of the multi-axis stage 100. As shown in FIG. 6, a thermal control system 600 can be used to heat or cool the multi-axis stage 100 but still allow the stage 100 to move circularly within an imaging system. The thermal control system 600 includes a base 601 that mounts through a platform 602 via a series of connectors 604. A system of standoffs 603 may be used to raise the platform 602 to a desired level within the imaging system. The standoffs are mounted to the platform 602 through a series of pins 608.

As shown, the base 601 fits within a cylindrical sleeve 610 that mates into the center of a metal ring 612. Mated to a top surface 614 of the sleeve 610 is a heat transfer body 620 including a heat transfer pipe 616 that is configured to move a heat transfer medium. In one embodiment, the heat transfer medium is cooled dry or liquid nitrogen and the temperature of the heat transfer plate 620 can be controlled by controlling the flow rate of the dry nitrogen with a flow meter (not shown) or adding a supplemental heat source, such as a thermal resistor. Thus, by controlling the type and amount of heat transfer medium circulating through the head transfer pipe 616 (and/or controlling the extra heat source), the user can control the resulting temperature of the heat transfer plate 620.

Above and in thermal contact with the heat transfer plate 620 is a bearing ring 630 that has a plurality of slots 635. Each of the slots 635 in the bearing ring 630 are configured to hold thermally conductive rollers 640. Above the rollers 640 is a top plate 650. The top plate 650 includes a mounting bracket 660 and centering pin 665 that are designed to mount with the multi-axis stage 100 and provide thermal heating or cooling functionality to the multi-axis stage 100. Top plate 650 can rotate around its axis driven via the base 601.

As can be envisioned, when a multi-axis stage is mounted into the mounting bracket 660, the stage can rotate in 360 degrees on top of the roller bearings (for example ball bearings or needle bearings) and still maintain thermal connectivity with the heat transfer medium that is flowing through the pipe 616. In this embodiment, all parts may be designed with a high thermal conductivity. For example, the roller bearings can be made of steel with a conductivity of 46 W/mK. The cold stage parts can be made of oxygen free copper, or other materials with a high thermal conductivity, for example, gold. In some embodiments, the temperature of the shuttle receiver can go down to −120° C., −130° C., −140° C., −150° C., −160° C., −170° C., −180° C. or less in temperature. In some embodiments, the device can be used to transfer heat such that the system is heated rather than cooled by pumping heated liquid or gas into the pipe 616.

It is noted that the stage can be equipped with one roller bearing offering the needed mechanical support and degree of freedom, while the stage further shows a second roller bearing thermally connecting the stage with a stationary cooling body, cooled by, for example, liquid nitrogen.

Figure 7A:
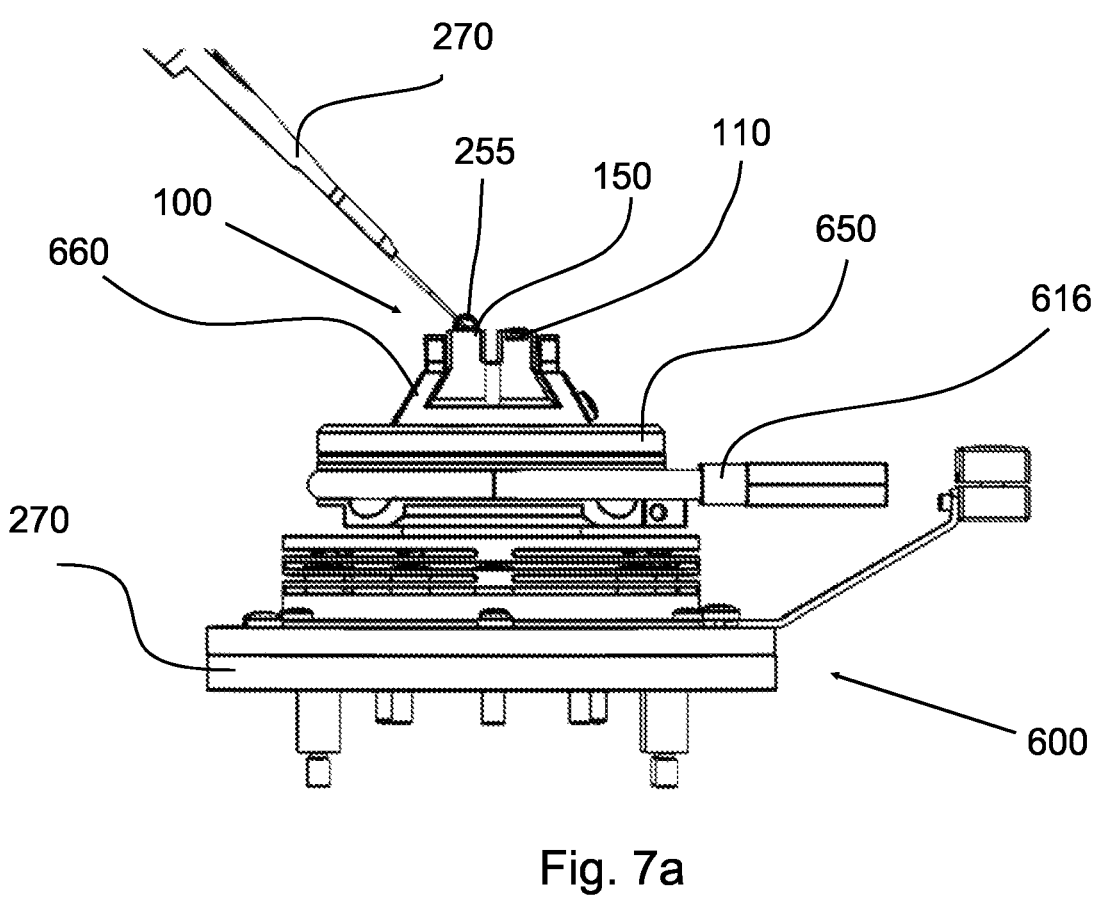
FIGS. 7*a* and 7*b* show different views of a multi-axis stage connected to a thermal control system.
Figure 7B:
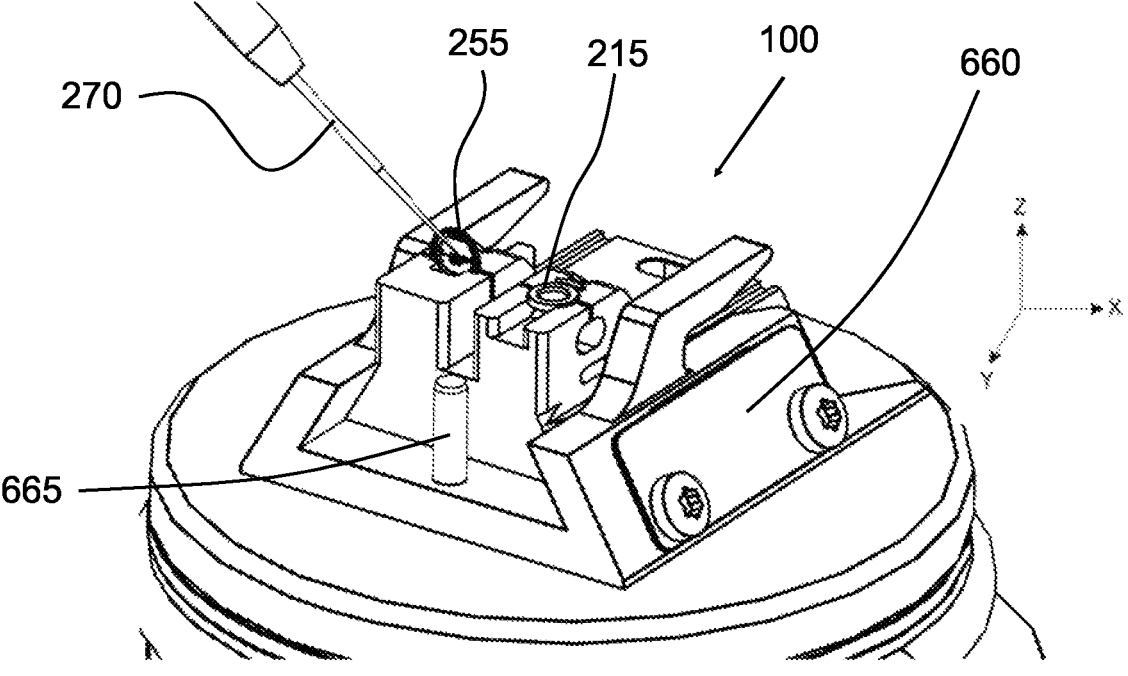

FIGS. 7a and 7b show different views of a stage 100 that is connected to the thermal control system 600 as described above. The stage 100 may be the multi-axis stage as described in reference to FIG. 1. In the embodiment shown, the stage 100 includes a bulk stage 110 and a grid stage 150. The stage 100 is connected to the thermal control system 600 in that the stage 100 is provided on top plate 650 and connected to mounting bracket 660 and centering pin 665 (see FIG. 7b).

As is shown, the needle 270 can be used to place a lamella-shaped sample in sample carrier 255, wherein said sample carrier has a grid member that is connected to a mechanical support contour, such as for example integrally connected. The sample carrier defines a plane, and is place substantially perpendicular to said bulk sample carrier. The bulk sample carrier 215 is placed substantially parallel to the surface of the top plate 650. In the embodiments shown in FIGS. 7a and 7b, the needle 270 is placed under an angle with respect to the bulk sample carrier 215 (i.e. under an angle with respect to the xy-plane), as well as under an angle with respect to the sample carrier 255 (i.e. under an angle with respect to the zx-plane. This allows for quick and easy transfer of a lamella shaped sample from the bulk sample carrier 215 to the sample carrier 255, for example by mere translational movement of the stage 100.

Detecting Frozen Status of Ice

Another embodiment relates to determining the status of vitreous ice in samples. This normally relies on TEM electron diffraction patterns usually taken at the thin sectioned area of interest on the frozen sample. Vitreous ice status is useful for to preserving natural structural forms, such as biological cell membranes or dispersed particulates. In contrast, crystalline ice disrupts those structures or distributions. Ring patterns show that the ice is amorphous (vitreous) whereas spot patterns show the presence of hexagonal or cubic crystalline structure. Quite often the vitreous result can be in dispute due to too sharp or too dull diffraction rings, or by which TEM electron gun it was produced; W, LaB6 or FEG.

When TEM sections are made one wants to know if the surrounding ice is crystalline or vitreous at that point. This helps the user know whether it is useful to continue with that sample or to start with a fresh sample.

One alternate embodiment is a method that can be used in the field emission gun SEM or SEM for samples where it is important to keep the temperature below the glass transition temperature of 136K (−137 deg C.). In this embodiment, the ice sample is FIB milled to the desired thickness so that when rotated and tilted to a horizontal plane it can be observed by an analyzing detector from below using the electron beam at a desired voltage. Tilting the ice sample from the horizontal plane to either a positive or negative angle allows the analyzing detector to observe a differing transmitted orientation contrast. This differing orientation contrast comes from the lattices of the differently orientated crystals within the thin sample if a crystalline form is present. If a crystalline form is not present because the sample is vitreous then the contrast remains constant as the sample is tilted.

This allows one to detect whether the sample has formed crystalline ice or not. The reason for this is that vitreous status is a state of random atomic structure and therefore will not show orientation contrast. This is a very direct and reliable way of determining the ice status of the sample when immediately made in a FEG SEM without having to make further transfer to a cryo-TEM system during which hexagonal ice contamination could compromise the result. With improvement of the SEM and Dual Beam instruments to resolve sub-nanometer resolution there are many cases where it is of little necessity to transfer to the TEM for direct resolution imaging or angular tomography. Therefore this method is convenient to verify the status of the sectioned ice within the SEM or Dual Beam instruments.

EQUIVALENTS

The foregoing written specification is considered to be sufficient to enable one skilled in the art to practice the present embodiments. The foregoing description and Examples detail certain preferred embodiments and describes the best mode contemplated by the inventors. It will be appreciated, however, that no matter how detailed the foregoing may appear in text, the present embodiments may be practiced in many ways and the present embodiments should be construed in accordance with the appended claims and any equivalents thereof.

The method and sample carrier are often described by means of lamella-shaped samples. In principle, however, the embodiments described herein are applicable to chunk-shaped samples, or other shaped samples, as well. More generally, the invention described herein is applicable to any sample emanating from a larger bulk sample.

The grid member comprises, in an embodiment, a half-moon grid, but it is noted that other grid shapes and grid types are possible as well, and that the invention is not limited to the use of a halfmoon grid. Other shapes may include ring-shaped, annular, or substantially closed contour shaped grids as well.

The term "comprising" is intended herein to be open-ended, including not only the recited elements, but further encompassing any additional elements.

The desired protection is determined by the appended claims.

The invention claimed is:

1. Method of preparing a sample in a focused ion beam microscope, comprising the steps of:
   providing a sample carrier having a mechanical support contour and a grid member connected thereto, the grid member is substatially planar, and the mechanical support contour completely encloses the grid member about a circumference of said planar grid member, and the mechanical support contour is ring-shaped;
   connecting said sample carrier to a grid stage of said charged particle microscope; and
   providing a bulk sample held by a bulk stage, wherein the bulk stae and the grid stage are mounted to a same base;
   using said foucsed ion beam for creating a sample in said bulk sample; and
   releasing said sample said bulk and transferring said sample to said smaple carrier using an elongate transport member, wherein said elongate transport member defines an angle with a plane defined by said sample carrier, and wherein said angle is kept substantially constant during at least a substantial part of transfer of said sample from said bulk sample to said sample carrier, and wherein the elongate transport member is temporarily attached to said sample;
   characterized by the step of connecting said sample to the grid member of the sample carrier in a condition wherein the mechanical support contour and the grid member are pre-connected to each other.

2. Method according to claim 1, comprising the step of connecting said sample to the grid member of the sample carrier in a condition wherein the sample carrier is connected to said mechanical stage device.

3. Method according to claim 1, wherein said grid member and said mechanical support contour are integrally formed.

4. Method according to claim 1, wherein translational movement is used for transferring said sample.

5. Method according to claim 4, wherein said translational movement is provided by means of relative movement between the elongated manipulator and a mechanical stage of said charged particle microscope.

6. Method according to claim 1, wherein said elongate transport member comprises a needle.

7. Method according to claim 1, wherein said method is performed under cryogenic conditions.

8. Sample carrier for use in a method according to claim 1, comprising:

the mechanical support contour that is arranged to be connectable to the mechanical stage device of the focused ion beam microscope; and the grid member that is pre-connected to said mechanical support contour and arranged for holding the sample, said grid member being free from any sample in said pre-connected state, and said grid member being arranged for receiving said sample in an assembled state of said sample carrier.

9. Sample carrier according to claim 8, wherein said grid member comprises a halfmoon grid.

10. Sample carrier according to claim 8, comprising said sample, wherein said sample comprises a lamella or chunk sample.

11. Sample carrier according to claim 8, wherein said grid member and said mechanical support contour are integrally formed.

* * * * *